United States Patent [19]

Eaton

[11] Patent Number: 5,369,371

[45] Date of Patent: Nov. 29, 1994

[54] ELECTRICAL RESISTANCE TEST DEVICE WITH AN ATTACHED COMPARISON RESISTANCE SET

[75] Inventor: Charles R. Eaton, Sunnyvale, Calif.

[73] Assignee: Encor Inc., Chandler, Ariz.

[21] Appl. No.: 991,219

[22] Filed: Dec. 15, 1992

[51] Int. Cl.⁵ .................. G01R 27/02; G01R 31/02
[52] U.S. Cl. ...................................... 324/707; 324/556; 324/601; 324/551
[58] Field of Search ............ 324/74, 549, 556, 601, 324/724, 713, 691, 715, 707, 551

[56] References Cited

U.S. PATENT DOCUMENTS

| | | | |
|---|---|---|---|
| 3,283,244 | 11/1966 | Proctor et al. | 324/549 X |
| 3,551,796 | 12/1970 | Holder et al. | 324/549 X |
| 3,758,855 | 9/1973 | Meyer | 324/549 X |
| 3,912,879 | 10/1975 | Lawson | 324/549 X |
| 4,163,936 | 8/1979 | Shufro | 324/549 X |

Primary Examiner—Gerard R. Strecker
Assistant Examiner—Diep Do
Attorney, Agent, or Firm—Richard R. Mybeck

[57] ABSTRACT

A megohm tester for determining resistance utilizing a relaxation oscillator which generates output pulses, at a rate dependent on an unknown resistance detected at a test site within an electronic apparatus, which can then be compared to known values provided as standards.

4 Claims, 1 Drawing Sheet

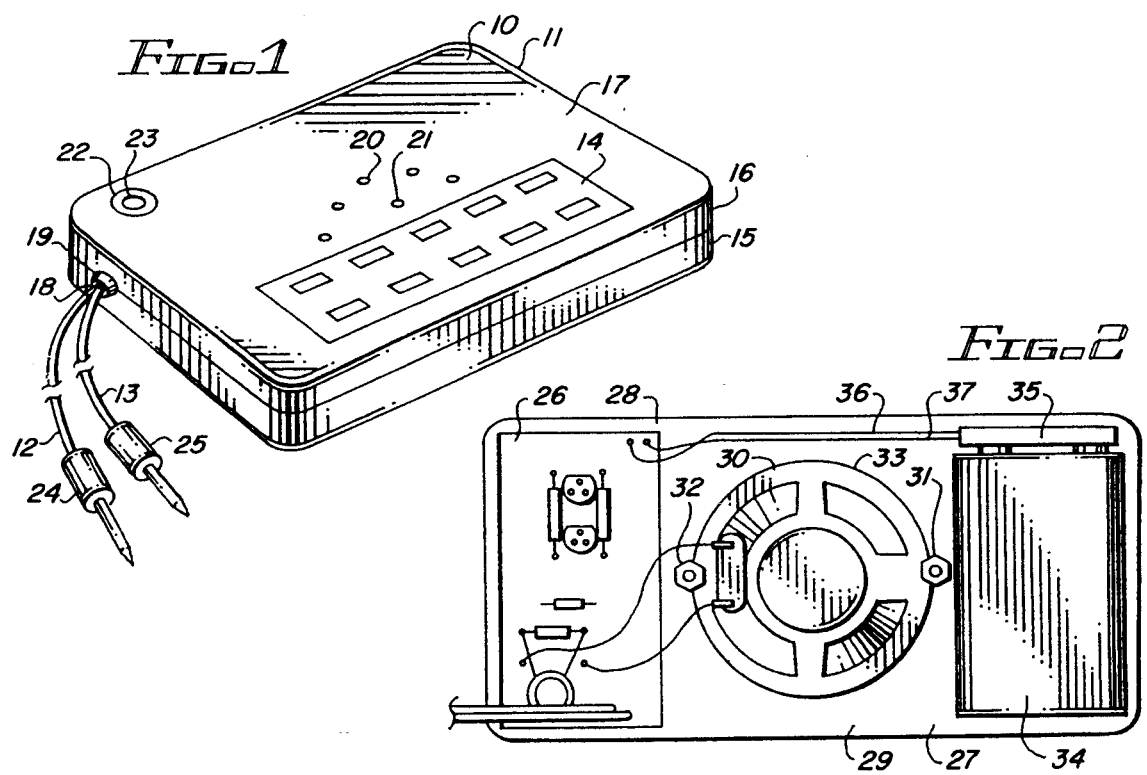
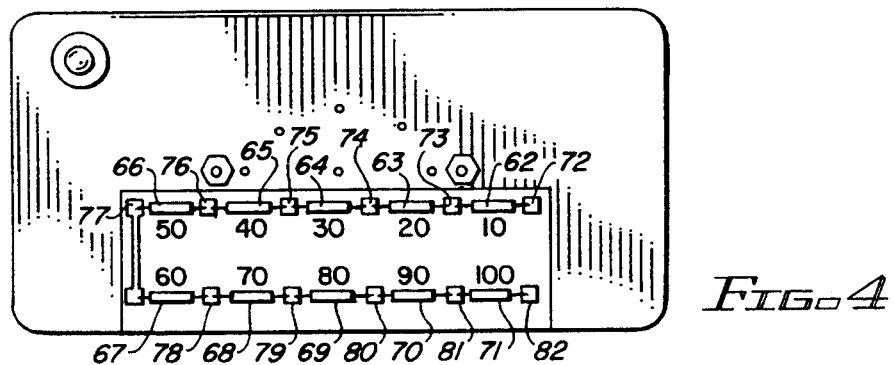
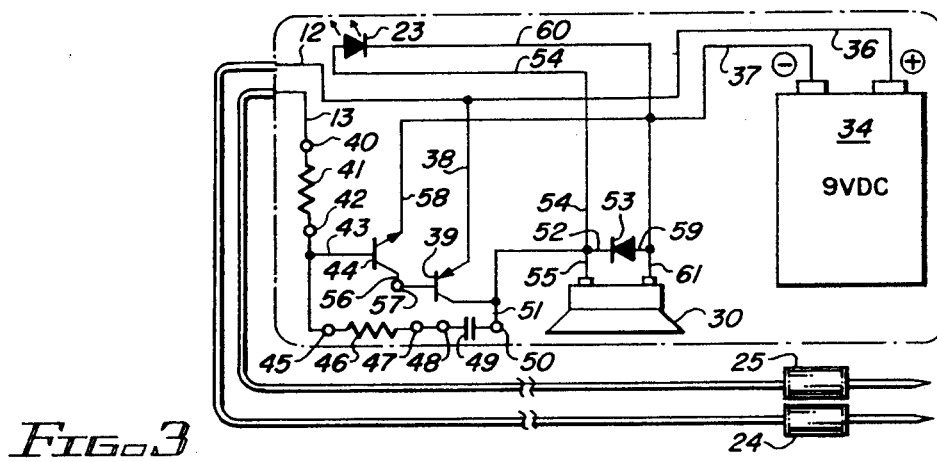

ELECTRICAL RESISTANCE TEST DEVICE WITH AN ATTACHED COMPARISON RESISTANCE SET

INTRODUCTION

This invention relates to a megohm tester and more particularly to a test device for measuring resistance paths between electrical circuit elements to provide both audible and visual indicators of the detected path.

BACKGROUND OF THE INVENTION

High resistance leakage paths can occur between elements of electronic circuits. These leakage paths can affect circuit performance and lead to subsequent failure of the device in which they occur. Most often, it is desired to locate these paths prior to finishing manufacturing steps to allow for repair or rework. While the precise value of the leakage resistance is seldom required the exact site and/or the approximate value of than leakage is important to the proper definition of the fault.

Currently the art utilizes high voltage to force current values which are then measured by common metering devices. While these devices provide an accurate measurement of the actual value of the leakage resistance, they are expensive to acquire, potentially dangerous to use because of the high voltages they employ, unnecessarily complex in their design and costly to repair.

The present invention is directed toward the solution of prior art problems by providing a novel and inexpensive, low voltage megohm tester having the capability of providing both visual and audible indication of resistances, even when those resistances exceed 100 megohms.

SUMMARY OF THE INVENTION

The present invention comprises a hand-held megohm tester which provides a visual and audible indication, variable over a wide range of values sensed, of resistance paths occurring between elements in an electronic apparatus.

In a preferred embodiment, the essential elements of the present invention comprise a portable hand-held case, a low voltage power source, a comparison resistance set, an insulated probe set, and means for sensing a resistance path and selectively converting the sensed path into a visible and/or audible signal. The case defines a cavity suitable for mounting a suitable power supply, a relaxation oscillator circuit board, light emitting diode (LED) indicator, and speaker. The probes of the probe set are attached to leads which emanate from the oscillator, and, as will appear, are used to isolate the electronic element or elements to be nested in a given apparatus. A comparison resistance set is secured to the case and provides ready access to known sample values against which the value of resistance sensed by the tester can be compared. The speaker is fixed inside the case, in juxtaposition to a plurality of discrete holes, each extending through the face of the case in spaced relationship to each other. The LED indicator is mounted to the circuit board in juxtaposition with another opening defined through the face of the case to permit observation of the LED indicator.

When the probes are contacted across electronic circuit elements whose leakage path is being sensed, the relaxation oscillator goes into oscillation at a rate established by the value of the resistance path. This oscillation produces an audible signal which emanates from the speaker, and likewise causes the LED to flash at the same oscillatory rate. The audible indication of resistance measured can be compared with the audible indication of the sample resistance values to provide the approximate value of the unknown leakage, each value having a different pitch.

Accordingly, it is a prime object of the present invention to provide a new and improved megohm tester which is inexpensive to construct, readily transportable for use, and which, in use, produces both a visual and an audible signal reflective of the resistance being measured.

Another object of the present invention is to provide a novel and unique hand carried low voltage megohm tester capable of safely measuring resistances in excess of 100 megohms.

Still another object of the present invention is to provide a hand held battery operated leakage tester that enables test personnel to readily locate defects in electrical devices during manufacture or installation thereby facilitating the quality control of these devices.

These and still further objects as shall herein appear are fulfilled by the present invention in a remarkably unexpected manner as will be readily discerned from the following detailed description of an exemplary embodiment thereof especially when read in conjunction with the accompanying drawings in which like parts bear like numerals throughout the several views.

BRIEF DESCRIPTION OF THE DRAWINGS

In the drawing:

FIG. 1 is a perspective view of a megohm tester embodying the present invention;

FIG. 2 is a plan view of the interior of the tester cover of FIG. 1;

FIG. 3 is a circuit diagram of a preferred embodiment of a megohm tester embodying the present invention; and, FIG. 4 is a plan view of the comparison resistance set of the megohm tester of FIG. 1.

DESCRIPTION OF THE PREFERRED EMBODIMENT

The present invention comprises a novel and unique megohm tester identified by the general reference 10. As shown in FIG 1, megohm tester comprises, inter alia, a case 11, probe wires 12, 13 and comparison set 14.

Case 11, as shown in FIG. 1., has a flanged base member 15 which is nested with a foraminous flanged cover 16. Base 15 and cover 16 are detachably fastened together using suitable securing means such as bolts and nuts (not shown) which extend from the upper surface 17 of cover 16, through mounting screw stand guides 31, 32 (shown in FIG. 2), into base 15. A notch 18 is defined adjacent one edge 19 of cover 16 to accommodate the egress of probe wires 12, 13 for a purpose to be hereinafter described in detail. The top surface 17 of cover 16 contains an arcuate array of discrete holes 20 disposed therethrough in a generally uniform pattern about the central point 21 of cover 16. An additional opening 22 is defined in a corner of cover 16 adjacent the proximal end thereof for receiving and exposing a light emitting diode (LED) 23.

The distal end of each probe wire 12, 13 is respectively fitted with suitable probes 24, 25, which are secured thereto using conventional techniques such as soldering.

FIG. 2 shows the assembly of the several parts of the tester which are mounted inside of cover 16 and includes a relaxation oscillator board 26 which is positioned at the left end of the cavity 27 which is defined by the coaction of upstanding flange 28, located on the perimeter of the lower surface 29 of cover top 16, and lower surface 29. Oscillator board 26 is suitably secured into cavity 27 such as by applying conventional epoxy cement thereto using well known techniques. Speaker 30 is mounted centrally within cavity 27 between mounting screw stand guides 31, 32 and in juxtaposition to holes 20. Speaker 30 is likewise suitably adhered at its periphery 33 to surface 29 as with conventional epoxy materials and bonding techniques. A suitable low voltage power source, such as battery 34, is placed at the right end (relative to the drawing) of cover 16 inside cavity 27 and held in place by the coaction of adjacent mounting screw stand guide 31, the left end portion of flange 28 and the front and rear portions of flange 28. Battery clip 35 makes polarized snap attachment to battery 34. Polarized leads 36, 37 extend from the battery clip 35 for attachment to oscillator board 26 as will be described below.

As shown in FIG. 3, probe wire 12 is connected between probe connector 24 and both the positive lead 36 of battery clip 35 and the emitter lead 38 of a suitable first transistor 39. Probe wire 13 is connected between probe connector 25 and one lead 40 of resistor 41. Lead 42 is in turn connected to both the base lead 43 of a suitable second transistor 44 and lead 45 of resistor 46. Lead 47 of resistor 46 connects to lead 48 of capacitor 49. Lead 50 of capacitor 49 connects to collector lead 51 of transistor 59, cathode lead 52 of diode 53, anode lead 54 of diode (LED) 23, and lead 55 of speaker 30. Collector lead 56 of transistor 44 connects to base lead 57 of transistor Negative battery lead 37 of battery clip 35 connects to emitter lead 58 of transistor 44, anode lead 59 of diode 53, cathode lead 60 of diode 23 and lead 61 of speaker 30. Each connection described above is accomplished using conventional techniques such as soldering.

Referring now to FIG. 4, a comparison set 14, which is secured to upper surface 17 of cover 16 as by bonding, comprises ten 10 Megohm resistors 62–71, each of which is soldered by conventional methods to a printed circuit board to form a series connection-providing resistance values from 10 to 100 megohms as measured between detection point 72 and detection points 73–82.

The circuit shown in FIG. 3 depicts the preferred circuitry and components. A battery clip 35 is connected to the poles of battery 34. Positive voltage from the battery 34 is supplied to one probe 24 and to the emitter of transistor 39. The collector of transistor 44 is connected to the base of transistor 39. The emitter of transistor 44 is connected to the negative pole of battery 34. The coactive combination of transistor 44 and transistor 39 create a relaxation oscillator circuit when connected as described hereinafter.

When probes 24, 25 are at imposed at preselected test sites across an unknown resistance on the item to be tested, current flows into the base of transistor 44 by means of resistor 41 thereby causing current to flow in the collector transistor 44. This current is applied to the base of transistor 39 causing it to likewise draw collector current. As transistor 39 draws collector current, the voltage on that collector will rise in a positive direction. This rise in voltage is coupled back to the base of transistor 44 the series connection of capacitor 49 and resistor 46. The result of this positive feedback causes transistor 44 to conduct into saturation or an "ON" state.

While in the "ON" state, the collector of transistor 39 is near the positive battery potential and speaker 30 is driven on (passes current). When capacitor 49 charges up to the battery potential the base drive current to transistor 44 drops off causing the collector current in transistor 44 to drop. This causes transistor 39 to also reduce its collector current. As this occurs, the voltage on the collector of transistor 39 starts to fall toward the negative battery potential. Capacitor 49 via resistor 46 now drives the base of transistor 44 lower and turns transistor 44 "OFF". The result is that both transistors 44, 39 turn "ON" for a period determined by the R-C combination of capacitor 49 by means of resistor 46. This current flow causes an output pulse which is audible as a Once the transistors turn "OFF", the current flowing through the series resistance comprised of unknown resistance between probes 24, 25 (Rp)+resistor 41+resistor 46 stare to charge capacitor 49. When said capacitor charges to a value near the supply voltage, base current starts to flow in transistor 44 and the cycle starts over again. The time it takes to charge capacitor 49 through the series resistance determines the output pulse period which is proportionate to the measured resistance. This period corresponds to the time between clicks in the speaker. Resistor 41 sets a minimum amount of resistance thus setting the maximum rate the circuit will oscillate. Resistor 41 also assures the drive current to the base of transistor 444 will never be enough to prevent oscillation.

The diode 53, shown as an E.I.A. 1N4148, and LED 23 prevent inductive overshoot transient voltages induced by the speaker 30 from harming the transistors 44, 39. The LED 23 also gives a visual indication of the oscillation rate.

FIG. 4 depicts the circuitry and components for the resistance comparison set 14 in one practice of the present invention. Resistors 62–71 provide decade increases in resistance value to yield sample values from 10 megohms to a total of 100 megohms. The probes 24, 25 may be connected between combinations of test pads 72–82 to yield comparison tones (pulse rates) between the comparison resistance and the actual electronic system under examination (Rp).

Table 1 illustrates typical components which may be utilized in the practice of the present invention.

TABLE 1

| COMPONENT | VALUE/ID |
|---|---|
| Transistor 31 | 2N4403 (PNP) |
| Diode 18 | Red LED |
| Transistor 32 | 2N4401 (NPN) |
| Diode 37 | 1N4148 |
| Resistor 33 | 180 K ohms |
| Capacitor 34 | 0.01 uF |
| Resistor 35 | 2.2 K ohms |
| Speaker 21 | 1.5", 8 ohm, 0.12 W |
| Resistor 62–71 | 10 Meg Ohm |
| Battery 22 | 9 Volt |

As can be seen from Table I, component values have been chosen to provide for test sample values up to greater than 100 megohms.

From the foregoing it is readily apparent that a novel and unique low voltage megohm tester and methods of using the same have been herein described and illustrated.

It is of course understood that such changes, alterations, and modifications as may readily occur to the artisan confronted with this disclosure are intended within the spirit of the present invention which is limited solely by the scope of the claims appended hereto.

Accordingly what is claimed is:

1. A megohm tester adapted to detect resistances at preselected test sites up to and in excess of 100 megohms comprising: a housing; probes for contacting said test sites and sensing resistance therein; oscillator means for receiving said sensed resistance from said probes and generating output pulses and an output pulse period proportionate to said resistance; transducer means for receiving said output pulses from said oscillator means and converting said output pulses into an audible add visual signal; a low voltage power source operatively connected to said probes, said oscillator means and said transducer means; a comparison set consisting of ten 10 megohm resistors serially connected and comparison detection points providing known combinations of resistance values of 10 megohms, 20 megohms, 30 megohms, 40 megohms, 50 megohms, 60 megohms, 70 megohms, 80 megohms, 90 megohms and 100 megohms, said housing containing said oscillator, said transducer and said power source, and further, said housing having an exit means for said probes and means for affixing said comparison set to said housing.

2. A megohm tester according to claim 1 in which said oscillator means comprises relaxation oscillator circuitry.

3. A megohm tester according to claim 1 in which said probes comprise: a first insulated probe wire having a first and second end, and a second insulated probe wire having a first and second end; a first elongated conductor having a proximal and a distal end, said distal end providing a contact area for engaging said test sites, said proximal end being soldered to said first end of said first insulated probe wire, a first insulating cover circumscribing a portion of said first elongated conductor and permitting said distal end to protrude therefrom; a second elongated conductor having a proximal and a distal end, said distal end providing a contact area for engaging said test sites, said proximal end being soldered to said first end of said second insulated probe wire, and a second insulating cover circumscribing a portion of said second elongated conductor to permit said distal end to protrude therefrom.

4. A megohm tester comprising: a housing; a comparison set; two probes for contacting preselected test sites and sensing resistance therein; oscillator means for receiving said sensed resistance from said probes and generating output pulses and an output pulse period proportionate to said resistance; transducer means for receiving said output pulses from said oscillator means and converting said output pulses into an audible and visual signal; a low voltage power source operatively connected to each of said probes, said oscillator means and said transducer means to facilitate the sensing of said output pulse generation and said audible and visual signal output thereof; said housing having a body portion and a cover portion, said body portion containing said oscillator, said transducer means and said power source having an exit means defined therein for passing said probes therefrom and means for affixing said comparison set to said cover of said housing; said probes having a first insulated probe wire having a first and second end, and a second insulated probe wire having a first and second end, a first elongated conductor having a proximal and a distal end, said distal end providing a contact area for engaging preselected test sites, said proximal end being soldered to said first end of said first insulated probe wire, a first insulating cover circumscribing a portion of said first elongated conductor and permitting said distal end to protrude therefrom, a second elongated conductor having a proximal and a distal end, said distal end providing a contact area for engaging preselected test sites, said proximal end being soldered to said first end of said second insulated probe wire, and a second insulating cover circumscribing a portion of said second elongated conductor to permit said distal end to protrude therefrom; said power source comprising: a low voltage battery having a positive and a negative terminal; said relaxation oscillator means having a first transistor having an emitter lead, a base lead and a collector lead, a second transistor having an emitter lead, a base lead and a collector lead, a first resistor having a first and a second lead, a capacitor having a first and a second lead, a diode having anode and cathode leads, a light emitting diode having anode and cathode leads, and a second resistor having a first and a second lead; said transducer means having a speaker having first and second leads, said positive battery terminal being connected respectively to said second end of said first insulated probe wire and said emitter lead of said first transistor; said base of said first transistor being connected to said collector lead of said second transistor; said collector of said first transistor being connected respectively to said first lead of said capacitor, said cathode lead of said diode, said anode lead of said light emitting diode, and said first lead of said speaker; said second lead of said capacitor being connected to said first lead of said first resistor; said negative battery terminal being connected respectively to said emitter lead of said second transistor and said anode lead of said diode, said cathode lead of said light emitting diode, and said second lead of said speaker; said second lead of said first resistor being connected to said base lead of said second transistor and said first lead of said second resistor; said second lead of said second resistor being connected to said second end of said second insulated probe wire; said comparison set comprising ten 10 megohm resistors serially connected and comparison detection points which provide known combinations of resistance values of 10 megohms, 20 megohms, 30 megohms, 40 megohms, 50 megohms, 60 megohms, 70 megohms, 80 megohms, 90 megohms and 100 megohms.

* * * * *